US006055198A

United States Patent [19]
Tailliet

[11] Patent Number: 6,055,198
[45] Date of Patent: Apr. 25, 2000

[54] DEVICE TO CHECK THE END OF A TEST

[75] Inventor: François Pierre Tailliet, Epinay sur Seine, France

[73] Assignee: SGS-Thomson Microelectronics S.A., Saint Genis, France

[21] Appl. No.: 08/897,869

[22] Filed: Jul. 21, 1997

[30] Foreign Application Priority Data

Jul. 22, 1996 [FR] France ................................. 96 09487

[51] Int. Cl.[7] ............................ G11C 7/00; G11C 29/00
[52] U.S. Cl. ............................................. 365/201; 365/195
[58] Field of Search ................................... 365/195, 196, 365/201; 326/16; 371/21.1, 21.2, 21.3

[56] References Cited

U.S. PATENT DOCUMENTS

| 4,049,956 | 9/1977 | Van Veen | 235/153 |
| 4,841,233 | 6/1989 | Yoshida | 324/73 R |
| 4,970,727 | 11/1990 | Miyawaki et al. | 371/21.3 |
| 5,305,267 | 4/1994 | Haraguchi et al. | 365/201 |
| 5,408,435 | 4/1995 | McClure et al. | 365/201 |
| 5,428,575 | 6/1995 | Fudeyasu | 365/201 |
| 5,594,694 | 1/1997 | Roohparvar et al. | 365/201 |
| 5,642,318 | 6/1997 | Knaack et al. | 365/201 |

FOREIGN PATENT DOCUMENTS 0 669 623  8/1995  European Pat. Off.  ........ G11C 29/00

OTHER PUBLICATIONS

French Search Report from French Patent Application 96 09487, filed Jul. 22, 1996.
Patent Abstracts of Japan, vol. 13, No. 245, Jun. 8, 1989 & JP-A-01 047972 (NEC Corp.).

*Primary Examiner*—David Nelms
*Assistant Examiner*—Son Mai
*Attorney, Agent, or Firm*—Wolf, Greenfield & Sacks, P.C.

[57] ABSTRACT

An integrated circuit comprises a memory zone, a test mode and at least one binary type of lock, said lock when it is in a first state permitting the operation of the integrated circuit in the test mode and when it is in a second state prohibiting the operation of the integrated circuit in test mode, wherein the integrated circuit comprises a dysfunction circuit that works when the lock is in the first state, said dysfunction circuit preventing the memory from working normally. The use of a dysfunction circuit makes it possible to reveal components whose test locks have not been activated as being defective.

38 Claims, 4 Drawing Sheets

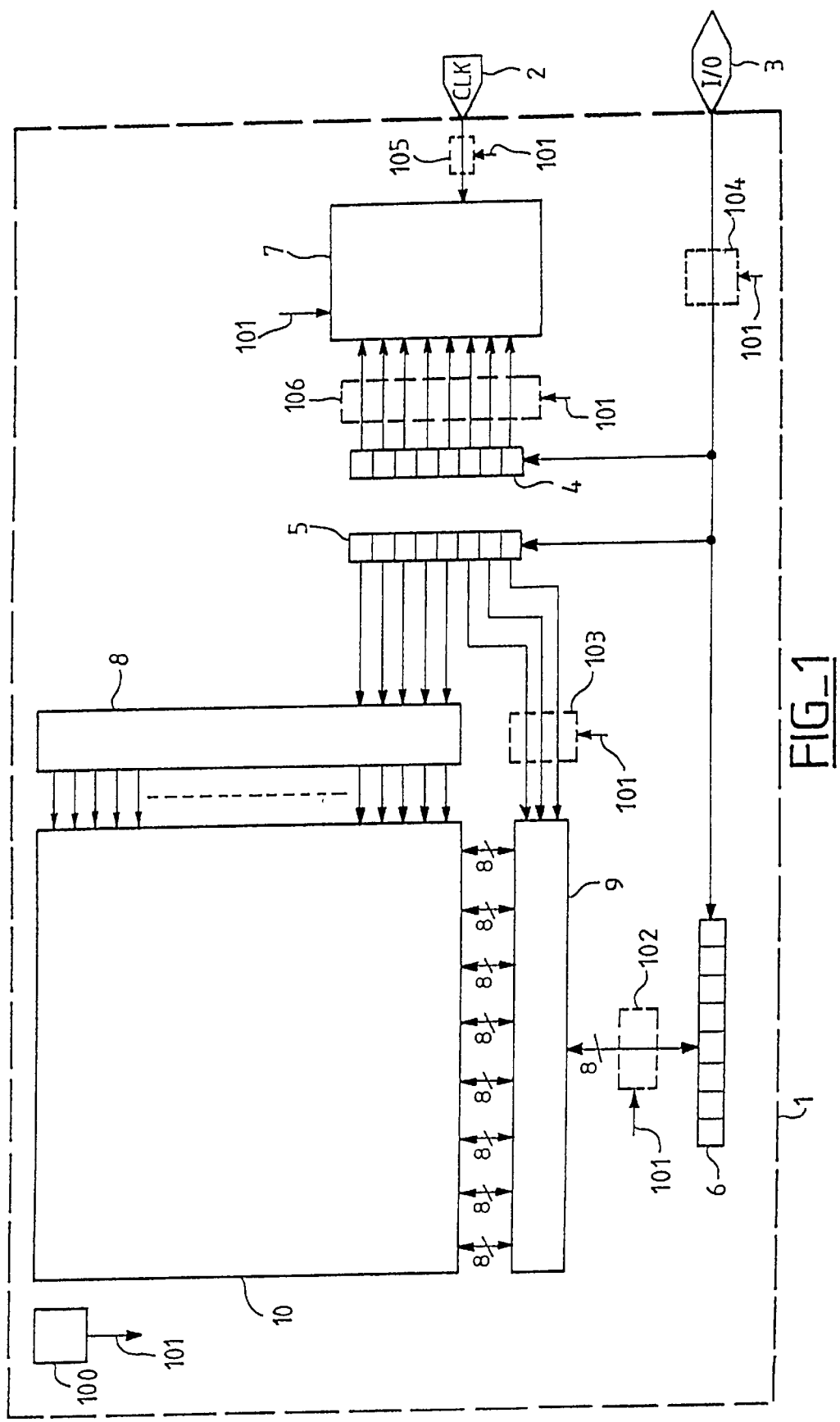
FIG_1

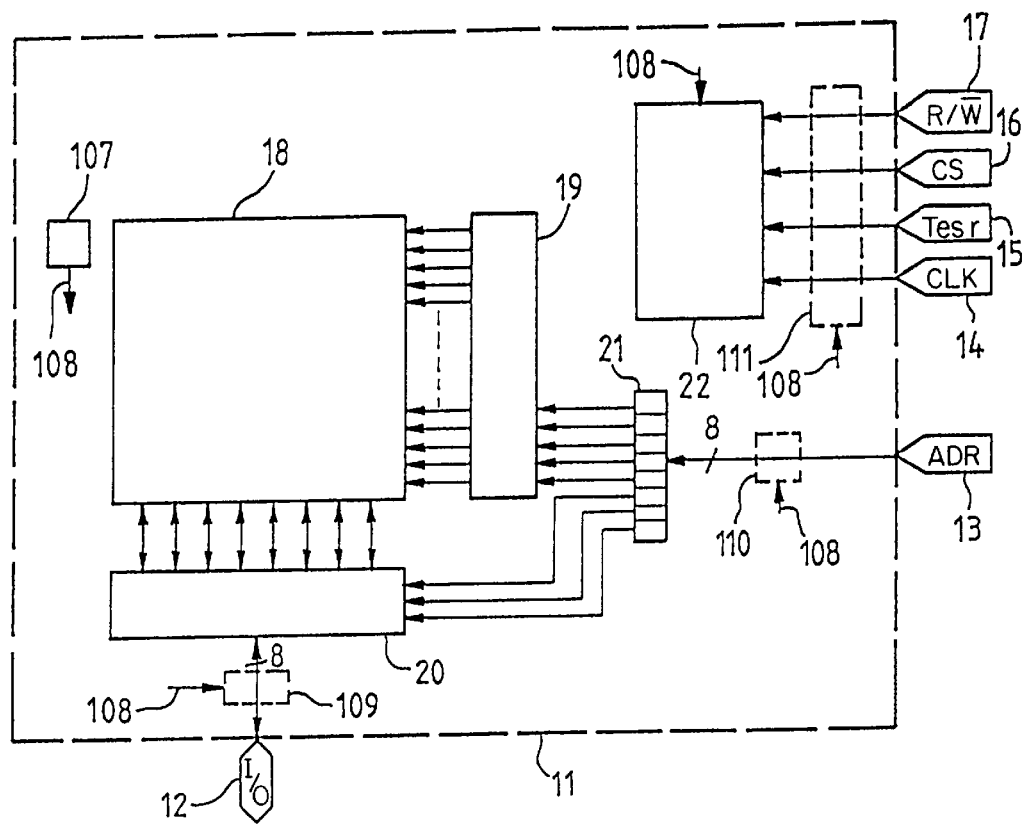
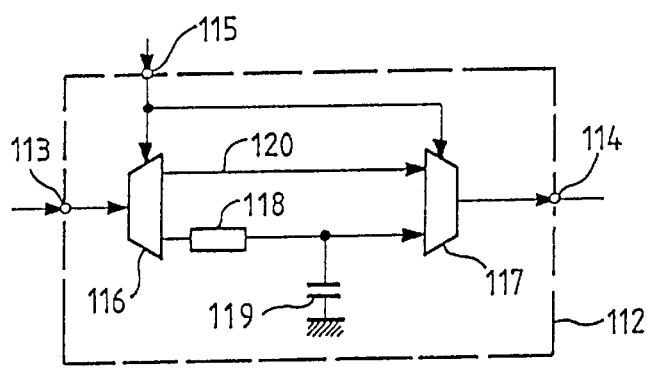
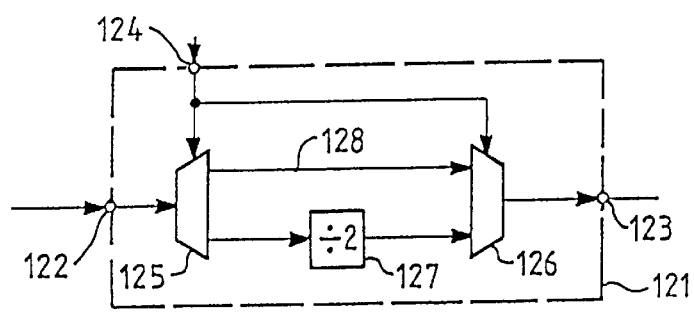

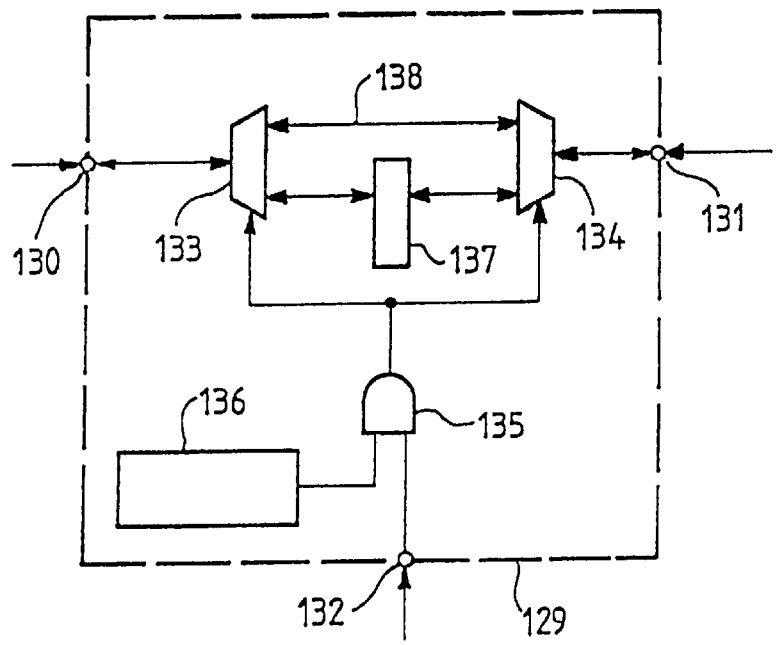
FIG_5
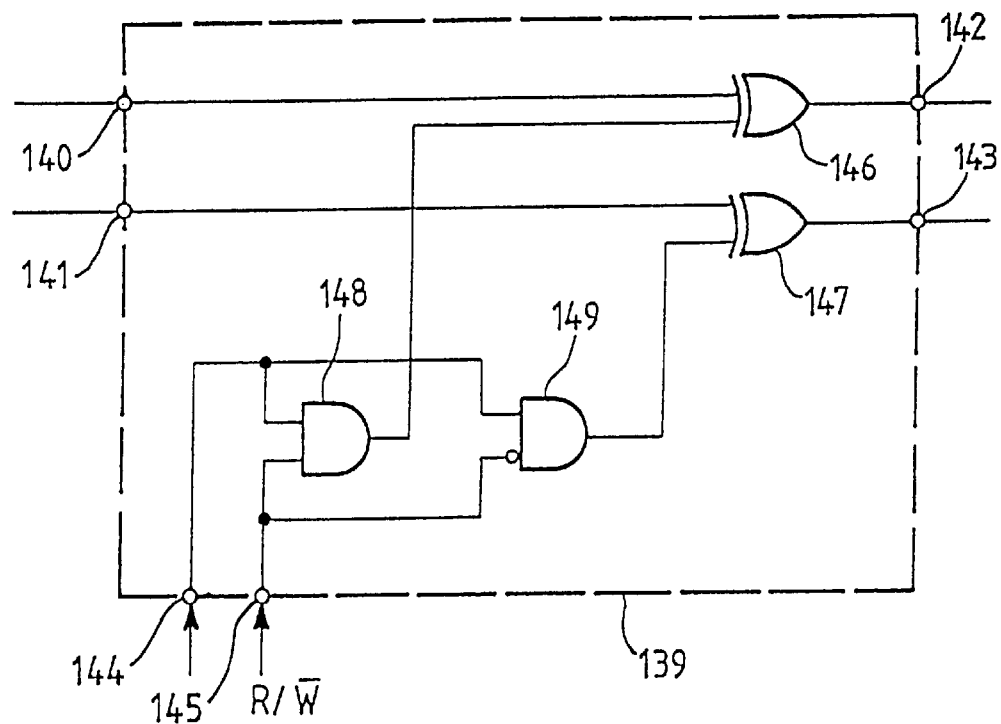
FIG_6

FIG_7
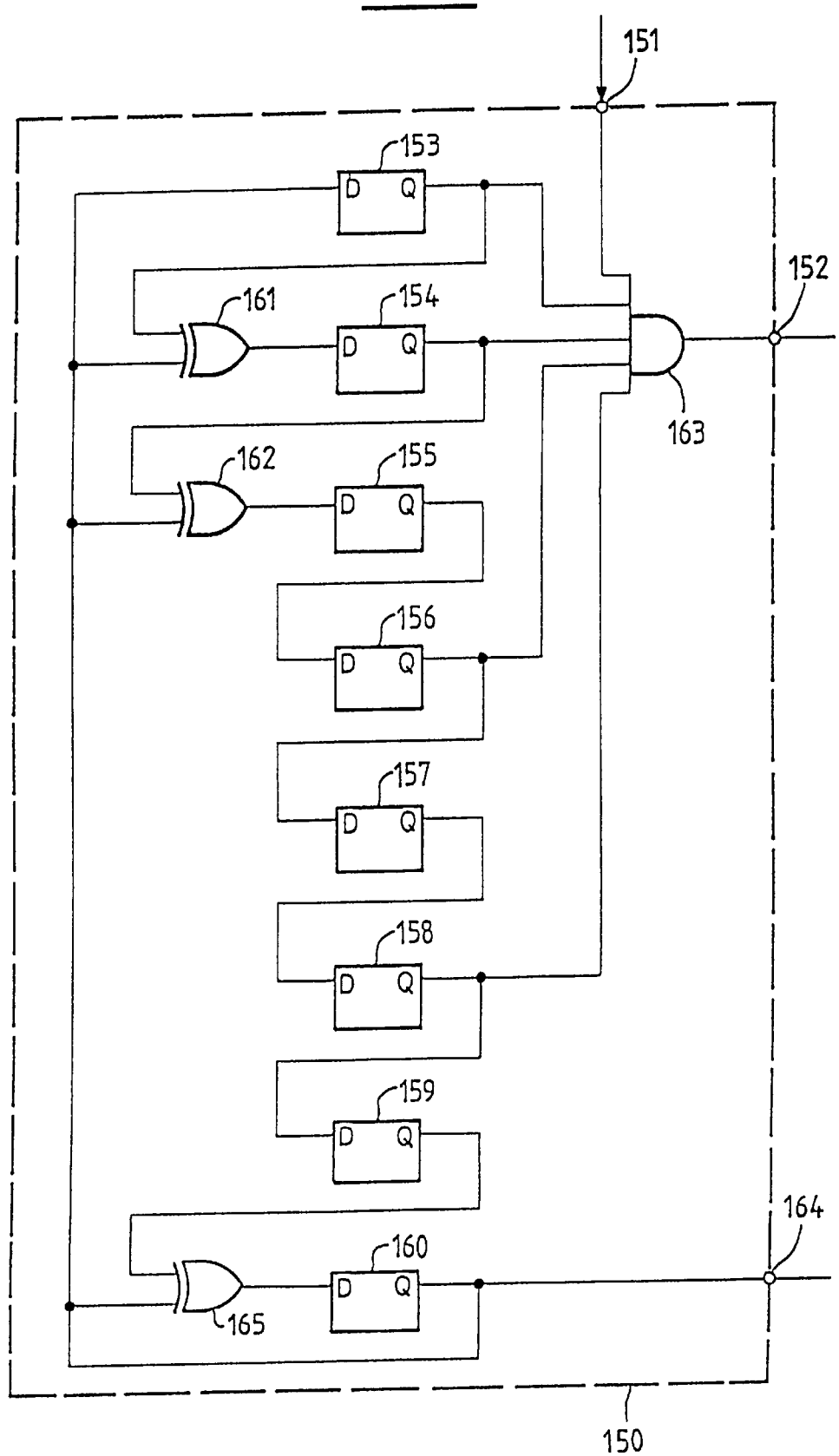

DEVICE TO CHECK THE END OF A TEST

BACKGROUND OF THE INVENTION

1. Field of the Invention

The invention relates to a device to check the end of a test aimed at achieving reliability in manufacturing tests performed on memories of all types.

2. Discussion of the Related Art

With the currently used submicron semiconductor technologies, it is important to carry out thorough tests on all the integrated circuits that come off the production line. For memories in integrated circuit form (or integrated circuits comprising memories) it is possible to test all the memory cells one by one by reading and then writing in each of the cells of this memory successively and repetitively. However, the ever greater sizes of memories are making these tests increasingly time consuming. To speed up the testing at the manufacturer's premises, accelerated testing procedures have been devised. In a memory organized in rows and columns, it is possible, for example, to load the data into one or more columns simultaneously on all the rows. Several test vectors may be sent in this way throughout the memory at far greater speed than by normal access. Besides, certain large-capacity memories can have one or more rows and or columns of additional memory cells used to replace defective cells if any. The test procedure will be used to connect the additional cells where they are needed.

Certain memories have read-protected and/or write-protected access zones that are not accessible (or accessible only once) in normal memory operation, and need to be tested. Those skilled in the art often resort to a mode of testing that permits certain operations specific to the manufacturer's testing stage. Since the running of the testing stages is not the object of the present patent application, those skilled in the art may refer to the many publications pertaining to accelerated tests, test vectors, memory repairing by cell substitution or the like, irrespective of whether they are serial-access or parallel-access memories of the SRAM, DRAM, ROM, PROM, EPROM or EEPROM type with or without protected access zones. The invention relates more particularly to the locking of the test phase.

U.S. Pat. No. 5,264,742 (hereinafter called the '742 patent), refers to the problem of locking the test phase of a chip card memory (with protected access zone). In the '742 patent, it is explained that the test phase needs to be locked because otherwise it is possible to access the protected access zone during the test phase. The locking is strictly prohibited in normal use. The '742 patent therefore uses two locks: one is conditioned by the other while the other can be activated only once. Although a reading of the '742 patent suggests that the test mode needs to be permanently locked for security reasons, there is no explanation given of how to ascertain that the locking is working properly, since the lock may be defective.

Furthermore, there are other types of memory for which the locking of the test mode is particularly worthwhile. In serial-access memories for example, the various operations possible (reading, writing, launching of tests, erasure, etc.) may be activated by instructions sent to an input/output pin that corresponds to the data and/or address input/output. There is a risk that an operating error might activate the launching of the test if it is not locked, thus possibly destroying the data elements present in the memory.

In the case of parallel-access memories, it is possible to have additional pins that are used solely for the test and must be neutralized (for example grounded) during normal operation. It is also possible that, in test mode, certain pins will be used for functions different from normal operation. In order to avoid operating errors, it is preferable to lock the manufacturing test. Naturally, for all the types of memory, it is possible to have available a test at the disposal of the user in normal operation of the integrated circuit. The user's test will be far more limited than the manufacturer's test and will not be capable of destroying data or enabling access to read-protected and/or write-protected zones.

SUMMARY OF THE INVENTION

The invention is directed to making a memory unusable if its end-of-production testing phase is not properly finished. A particular operation is used to make the protected memories reliable if a test mode lock should be defective or be made defective or even if it should become reversible.

One embodiment of the invention is an integrated circuit comprising a memory zone, a test mode and at least one binary type of lock, the lock includes a first state permitting the operation of the integrated circuit in the test mode and a second state prohibiting the operation of the integrated circuit in test mode. The integrated circuit also comprises a dysfunction circuit that works when the lock is in the first state, this dysfunction circuit preventing the memory from working normally.

The dysfunction circuit prohibits the integrated circuit from working normally for a user if the test mode is permitted. Moreover, if the circuit is defective at the lock, it cannot be used properly except in a manufacturing test. Again, the dysfunction circuit enables an accurate test of all the functions necessary for normal operation.

There are several alternative embodiments for the dysfunction circuit. It is possible for example to bring the dynamic characteristics of the integrated circuit into play, with the dysfunction circuit comprising means that delay signals in order to increase the time of access to the memory (or increase the frequency of a clock). The dysfunction circuit may also comprise a register to delay the data elements by at least one clock cycle at the end of a certain number of clock cycles.

In another embodiment of the present invention, the dysfunction circuit comprises an address-shuffling circuit to shuffle the addresses, the address-shuffling circuit receiving or not receiving a read/write signal. The shuffling of the addresses differs according to whether the operation is a read operation or a write operation. Alternatively, the dysfunction circuit acts on an instruction decoding circuit in order to scramble instructions given to the memory.

Another alternative embodiment includes a read substitution circuit that randomly or pseudo-randomly replaces the read data by erroneous data. Another embodiment includes a write substitution circuit that randomly replaces the data to be written by erroneous data. Another embodiment includes a random or pseudo-random writing circuit that writes a random data element at a random or pseudo-random address whenever a random or pseudo-random number of write and/or read cycles has been carried out.

These alternative embodiments may be used independently of one another or in conjunction with one another depending on the requisite constraints of reliability. If, for any reason, the test mode is not locked for normal use, the circuit will malfunction and will be declared to be unusable by its first user.

BRIEF DESCRIPTION OF THE DRAWINGS

Other features and advantages of the invention shall appear from the following detailed description, made with reference to the appended drawings, of which:

FIG. 1 gives a schematic view of a serial-access memory according to the invention, FIG. 2 gives a schematic view of a parallel-access memory according to the invention, FIGS. 3 to 6 give a schematic view of the possible embodiments of the dysfunction circuit according to the invention, FIG. 7 shows a pseudo-random generator used in the invention.

DETAILED DESCRIPTION

FIG. 1 shows a serial memory 1 that has a clock input terminal 2 and an input/output terminal 3. The clock input terminal is designed to receive a clock signal used to set the rate of the entire memory 1. The input/output terminal 3 is designed to receive and send a series of bits that correspond equally well to addresses, instructions or data elements. Conventionally, there are serial-access memories that use different terminals for the different binary information elements, for example one terminal for the data elements, one terminal for the addresses and one or two terminals to control the memory. The invention can easily be transposed to such memories.

The input/output terminal 3 is connected to an input of an instruction register 4, an input of an address register 5 and an input/output of a data register 6. The instruction register 4 and the address register 5 each have eight bits. Each of them has eight parallel outputs, one respectively for each bit. The address register 5 furthermore has the possibility of being used as an address counter. The data register 6 has eight bits and eight parallel inputs/outputs, one respectively for each bit. The three registers 4, 5 and 6 generally have different control signals that are not shown in order to simplify the diagram. A control circuit 7 manages all the control signals needed for the efficient operation of the memory 1. These control signals have not been shown.

The control circuit 7 furthermore has a clock input connected to a clock input terminal 2 and eight instruction inputs respectively connected to the eight outputs of the instruction register 4. This control circuit will inter alia decode the contents of the instruction register in order to generate the appropriate sequence of signals. The different possible instructions could be for example instructions for reading, writing, automatic test launching, the reading of one or more blocks, the writing of one or more blocks (one block corresponding for example to 16 bytes).

The address register 5 is connected to a row decoder 8 by means of five of these parallel outputs which correspond for example to the five most significant bits of the address register. The address register 5 is also connected to three selection inputs of a column decoder 9.

In one example, the row decoder 8 has 32 outputs, only one of which is activated as a function of the five bits received from the address register 5. Each of the outputs of the row decoder 8 is connected to a row of a memory zone 10 organized in rows and columns of elementary storage cells. Furthermore, the column decoder 9 has eight information inputs/outputs respectively connected to eight parallel inputs/outputs of the data register 6 and also has eight times eight selectable inputs/outputs respectively connected to the columns of the memory zone 10.

A test lock 100 is formed by a fuse memory cell or an OTP (one time programmable) type memory cell. It gives a test-authorizing information element on a wire 101, said information being, during the manufacture of the integrated circuit, in a first state, and being, at the end of the manufacturing test, in a second state. This wire 101 is connected firstly to the control circuit 7 and secondly to a dysfunction circuit having, in this example, five dysfunction modules 102 to 106. Those skilled in the art will note that one time programmable cells commonly exist in large-capacity memories. They are generally used to connect supplementary memory cells (also known as redundancy cells) in place of defective memory cells.

The test lock 100 acts on the control circuit 7 to permit or inhibit the decoding of a test activation instruction or to replace the sequencing of a manufacturer's test by a user's test that is more limited and entails no risk of accessing a possibly protected memory zone or does not allow certain operations that may be detrimental to data present in the memory zone 10. The first state of the lock 100 corresponds to the validation of the manufacturer's tests and the second state corresponds to the inhibition of the manufacturer's tests. Furthermore, the first state will validate the working of the different dysfunction modules 102 to 106 and the second state will make them transparent.

The module 102 is placed between the data register 6 and the column decoder 9. The module 102 will act on the contents of the data elements. Several possibilities can be envisaged. The module 102 may, for example, shuffle the connections between the memory and the data register in a known way, thus giving the manufacturer the ability to carry out his tests without difficulty. It is also possible to introduce an error randomly into the data elements in ensuring that there are no two successive errors. Thus, if there is an error during a manufacturer's test, the same operation can be repeated in order to ascertain that the error is real.

The module 103 is placed between the address register 5 and the column decoder 9. It is also possible to act on the connection between the address register 5 and the row decoder 8. The action of this module 103 is the same as that of the module 102. Since the random action on the addresses may lead to wrong recordings at unknown addresses, those skilled in the art would have to use the random modification of the addresses with certain precautions.

The module 104 is placed between the input/output terminal 3 and the three registers 4, 5 and 6. A module 104 of this kind may have an effect on the dynamic input and output parameters or it may consist of a shifting of the input and/or output information elements with respect to the clock signal. The shift may also take place on a bit used for the communications protocol of a particular series link.

The module 105 is placed between the clock input terminal 2 and the control circuit 7. The action of the module may be carried out, for example, on the dynamic parameters or it may include, for example, the division of the input frequency of the clock signal.

The module 106 is placed between the instruction register 4 and the control circuit 7. A module of this kind will, for example, shuffle the instructions according to a technique known to the manufacturer only, which will enable the manufacturer to ascertain that the memory is working efficiently.

Of course, the invention pertains to the use of a dysfunction circuit that comprises at least one of the modules 102 to 106. Furthermore, while several variants are possible on one of the modules 102 to 106, those skilled in the art could very well use one or more of the variants simultaneously.

Before providing a detailed description of certain embodiments of the dysfunction modules 102 to 106, it is preferable to describe an embodiment of the invention using a parallel-access memory 11 shown in FIG. 2.

This parallel-access memory has a two-way data bus 12 comprising for example eight parallel-connected input/output terminals, a one-way address bus 13 comprising, for example, eight parallel-connected input terminals and four control terminals 14 to 17 corresponding to different signals which are respectively a clock signal, a test activating signal, a package selection signal and a read/write signal.

The internal architecture of the memory 11 has a certain resemblance with the memory 1. A memory zone 18 organized in a matrix of, for example, 32 rows and eight times eight columns contains the elementary storage cells. A row decoder 19 with 32 outputs and five inputs, each output of the row decoder 19 being connected respectively to each of the rows of the memory zone 18, selects one of the rows of the memory zone 18 as a function of the information element present at its five inputs. A column decoder 20 has eight information inputs/outputs, eight times eight selectable inputs/outputs and three selection inputs. The eight information inputs/outputs are respectively connected to the eight input/output terminals of the data bus, and the eight times eight selectable inputs/outputs are connected respectively to the eight times eight columns of the memory zone 18. An address register 21 contains eight bits and has eight inputs connected to the address bus 13 and eight outputs. Five of these outputs, corresponding to the five most significant bits contained in the address register 21, are connected to the five inputs of the row decoder 19. Three outputs of the address register 21, corresponding to the three least significant bits of this address register 21, are connected to the three selection inputs of the column decoder 20. This address register 21 is used to store an address during the read and write operations. A control circuit 22 is connected to the four control terminals 14 to 17. This control circuit 22 is used to synchronize and sequence different operations that can be performed by the memory 11 as a function of the signals present at the four control terminals 14 to 17. The different connections with the other elements of the memory are not shown in order to simplify the drawing of FIG. 2.

A test lock 107 is formed by a fuse memory cell or an OTP (one time programmable) type memory cell. It gives a test-authorizing information element on a wire 108. This information is generated, during the manufacture of the integrated circuit, in a first state. At the end of the manufacturing test, it is generated in a second state. This wire 108 is connected firstly to the control circuit 22 and secondly to a dysfunction circuit having, in this example, three dysfunction modules 109 to 111. Those skilled in the art will note that one time programmable cells commonly exist in large-capacity memories. They are generally used to connect supplementary memory cells in place of defective memory cells.

The test lock 107 acts on the control circuit 22 to permit or inhibit the activation of a test or to replace the sequencing of a manufacturer's test by a user's test that is more limited and entails no risk of accessing a protected memory zone, if any, or does not permit certain operations that may be detrimental to data present in the memory zone 18. A first state of the lock 107 corresponds to the validation of the manufacturer's tests and a second state corresponds to the inhibition of the manufacturer's tests. Furthermore, the first state will validate the working of the different dysfunction modules 109 to 111 and the second state will make them transparent.

The module 109 is placed between the data bus 12 and the column decoder 20. The module 109 will act on the contents of the data elements. Several possibilities can be envisaged. The module 109 can, for example, shuffle the connections between the memory and the data register in a known way, thus giving the manufacturer the ability to carry out his tests without difficulty. It is also possible to introduce an error randomly into the data in seeing to it that there are no two successive errors. Thus, if there is an error during a manufacturer's test, the same operation can be repeated in order to ascertain that the error is real. Since the module 109 is connected to terminals communicating with the exterior, the module 109 may, as the case may be, modify dynamic parameters.

The module 110 is placed between the address register 21 and the address bus 13. This module 110 has an effect of the same type as that of the module 109. Since random action on the addresses could give rise to erroneous recording operations at unknown addresses, those skilled in the art will have to use the random modification of the addresses with certain precautions.

The module 111 is placed between the control terminals 14 to 17 and the control circuit 22. The effect of a module 111 of this kind may be on the dynamic input and output parameters or it may consist of a shifting of the input and/or output information elements with respect to the clock signal or it may have effects on the clock frequency.

The various functions of the dysfunction modules 102 to 106 and 109 to 111 are fairly similar in certain cases and may therefore be used at several places. Although a single serial-access memory and a single parallel-access memory have been described, those skilled in the art could transpose the description to variants of memories existing at the present time. Furthermore, for the two examples of memory cited, there is no question of an access authorizing verification circuit but, since the invention does not relate directly to the checking of authorization for access, it is not necessary to show such circuits. Similarly, the memories described can be accessed in read and write mode but it is quite possible to transpose the invention to ROM or read-only type memories. The invention is also totally independent of the size of the memory. Furthermore, integrated circuits, for example of the microcontroller type, have DRAM, SRAM, ROM, PROM, EPROM or EEPROM type integrated memories. It therefore goes without saying that the invention can be used in these memories which do not constitute the totality of an integrated circuit.

FIG. 3 shows a dysfunction module 112. This module 112 is used to downgrade the input dynamic characteristic (or output dynamic characteristic) and it may be used directly instead of the modules 105, 110 or 111. The module 112 has one signal input 113, one signal output 114 and one instruction input 115. The instruction input receives the locking information carried by one of the wires 101 or 108. The signal input 113 receives one of the signals present at an input terminal, for example the terminal 2 and the output signal gives the signal for example to the control circuit 7. The module 112 has a demultiplexing circuit 116 having one input, one selection input, a first output and a second output, the input being connected to the signal input 113, the selection input being connected to the instruction input 115. A multiplexing circuit 117 has a first input, a second input, a selection input and an output, the selection input being connected to the instruction input 115 and the output being connected to the signal output 114. When the signal present at the instruction input 115 is in a first state, the multiplexing circuit 117 sets up a connection between its first input and its output and the demultiplexing circuit 116 sets up a connection between its first output and its input. When the signal present at the instruction input 115 is in a second state, the multiplexing circuit 117 sets up a connection between a second input and its output and the demultiplexing circuit 116 sets up a connection between its second input and its output. A resistor 118 sets up the connection between the first output of the demultiplexing circuit 116 and the first input of the multiplexing circuit 117. A capacitor 119 is connected between the first input of the multiplexing circuit 117 and the ground. The second output of the demultiplexing circuit 116 is connected to the second input of the mutiplexing circuit 117 by means of the conductor 120. The module 112 thus formed behaves, when the signal applied to the instruction input 115 is in a first state, like an RC cell whose time constant depends on the resistor 118 and on the capacitor 119. When the signal applied to the instruction input 115 is in a second state, the module 112 behaves like a single connection wire.

Variants are possible to enable the use of this module 112 in two-way mode. It is possible for example to use multiplexer/demultiplexer circuits that are two-way circuits. It is also possible to eliminate the multiplexing circuit 117 and demultiplexing circuit 116 and replace them with a two-way transfer gate in parallel with the resistor 118, the capacitor 119 being eliminated and replaced by the existing parasitic capacitors. With modifications of this kind, this module 112 can also be used instead of the modules 104 and 109.

In FIG. 4, another embodiment of a dysfunction module 121 is shown. This module 121 is used to downgrade the dynamic input characteristic by frequency division and it may be used directly instead of the modules 105 or 111. The module 121 has a signal input 122, a signal output 123 and an instruction input 124. The instruction input 124 receives the locking information borne by one of the wires 101 or 108. The signal input 122 receives one of the signals present at an input terminal, for example the terminal 2, and the signal output sends the signal, for example, to the control circuit 7. The module 121 has a demultiplexing circuit 125 with one input, one selection input, a first output and a second output, the input being connected to the signal input 122, the selection input being connected to the instruction input 124. A multiplexing circuit 126 has a first input, a second input, a selection input and an output. The selection input is connected to the instruction input 124 and the output is connected to the signal output 123. When the signal present at the instruction input 124 is in a first state, the multiplexing circuit 126 sets up a connection between its first input and its output and the demultiplexing circuit 125 sets up a connection between its first output and its input. When the signal present at the instruction input 124 is in a second state, the multiplexing circuit 126 sets up a connection between its second input and its output and the demultiplexing circuit 125 sets up a connection between its second output and its input. A frequency divider 127, having one input and one output, its input being connected to the first output of the demultiplexing circuit 125 and its output being connected to the first input of the multiplexing circuit 126, generates, at its output, a signal whose frequency is divided for, example, by two with respect to its input. The second output of the demultiplexing circuit 125 is connected to the second input of the multiplexing circuit 126 by means of a conductor 128. The module 121 thus formed behaves, when the signal applied to the instruction input 124 is in a first state, as a frequency divider and, when the signal applied to the instruction input 124 is in a second state, as a single connection wire. This module 121 is particularly well suited for operation at clock inputs. The effect produced is minimal and can easily be circumvented when it is known. However, it produces an immediate effect of malfunctioning. There are many possibilities for making frequency dividers by means of counters or flip-flop circuits that are available to those skilled in the art.

FIG. 5 shows another embodiment of a dysfunction module 129. This module 129 is used to downgrade a dynamic input characteristic and it may be used directly instead of the modules 102, 104, 109 or 110. The module 129 has a first signal input/output 130, a second signal input/output 131 and an instruction input 132. The instruction input 132 receives the locking information carried by the wire 108. The first signal input/output 130 is connected, for example, to the input/output terminal 3 and the second signal input/output 131 is connected, for example, to the registers 4 to 6. The module 129 has a first multiplexing/demultiplexing circuit 133 and a second multiplexing/demultiplexing circuit 134, each of these circuits having a single-wire input/output, a selection input, a first selectable input/output and a second selectable input/output, each single-wire input/output being connected respectively to the first and second signal input/output 130 and 131. In a particular example, a logic gate 135 with two inputs and one output has its output connected to the selection inputs of the first and second multiplexing/demultiplexing circuit 133 and 134 and the first of its input connected to the instruction input 132. A counter 136, having one output, gives a counting signal that is in a first state for a certain number of clock cycles (for example five cycles) and is in a second state for another number of clock cycles (for example three cycles), the output of the counter being connected to the second of the inputs of the logic gate 135. The different control signals of the counter 136, which are conventionally clock signal and reset signals, have been omitted in order to simplify the drawing. When the signal present at the instruction input 132 is in a first state and the signal present at the output of the counter 136 is also in a first state, the first and second multiplexing/demultiplexing circuits 133 and 134 set up a connection between their first selectable input/output and their single-wire input/output. When the signal present at the instruction input 132 is in a second state or when the signal present at the output of the counter 136 is in a second state, the multiplexing/demultiplexing circuits 133 and 134 set up a connection between their second selectable input/output and their single-wire input/output. A two-way shift register cell 137 having two information inputs/outputs, each of these information inputs/outputs being connected to the first selectable input/output of each of the two multiplexing/demultiplexing circuits 133 and 134, produces a shift at each clock stroke in a direction corresponding to the direction of movement of the information elements flowing between the first and second signal inputs/outputs 130 and 131. The control signals of the shift register cell 137 have not been shown in order to simplify the drawing. The second inputs/outputs of each of the multiplexing/demultiplexing circuits 133 and 134 are connected together by means of a conductor 138. The module 129 thus formed behaves, when the signal applied to the instruction input 132 is in a first state, as an information delaying unit that regularly loses one information element. When the signal applied to the instruction input 132 is in a second state, the module 129 behaves as a single connection wire.

Variants of this module 129 are possible. It is possible to eliminate the counter 136 and the logic gate 135 to make direct use of the instruction input 132 instead of the output of the logic gate 135. It is also possible to use several series-connected shift register cells 137. It is also possible to place several of these modules in parallel by using a single counter 136 and a single logic gate 135. With regard to the test with a module 129 of this kind, it is necessary to take account of two errors for each rotation of the counter 136 multiplied by the number of shift register cells 137 that have been series-connected. Preferably, this module 129 will be used with big counters, for example counters by 256, and a single shift register so as not to have too many repetitions of test operations due to errors caused by the dysfunction device.

FIG. 6 shows a module 139 with a first signal input 140 and a second signal input 141, a first signal output 142 and a second signal output 143, and a first instruction input 144 and a second instruction input 145. Since this module 139 is a one-way module, it is particularly well suited to being used instead of the modules 103 and 110. Those skilled in the art would have to increase the number of signal inputs and outputs 140 to 143 as a function of the number of wires to be shuffled. In one example, the signal inputs 140 and 141 are connected to the address register 21, the signal outputs 142 and 143 are connected to the column decoder 20, the first instruction input is connected to the wire 108 and the second instruction input 145 receives a signal coming from the control circuit 7 which indicates a reading operation and a writing operation. Each signal output 142 and 143 is respectively connected to an output of an XOR gate 146 and 147. Each of the XOR gates 146 and 147 furthermore has a first input and a second input. Each of the first inputs of the XOR gates 146 and 147 is respectively connected to each of the signal inputs 140 and 141. Each of the second inputs of the XOR gates 146 and 147 is respectively connected to an output of a first logic gate 148 and a second logic gate 149. Each of the logic gates 148 and 149 furthermore possesses a first input and a second input. Each of the first inputs of the logic gates 148 and 149 is connected to the first instruction input 144. Each of the second inputs of the logic gates 148 and 149 is connected to the second instruction input 145. The first logic gate 148 has its output at a level "1" when the first instruction input 144 is in a first state and when the second instruction input 145 is in a first state. The first logic gate 148 has its output at a level "0" when the first instruction input 144 is in a second state or when the second instruction input 145 is in a second state. The second logic gate 149 has its output at a level "1" when the first instruction input 144 is in its first state and when the second instruction input 145 is in its second state. The first logic gate 148 has its output at a level "0" when the first instruction input 144 is in its second state or when the second instruction input 145 is in its first state. The working of the module 139 as described here above is as follows:

when the first instruction input 144 is in the first state and the second instruction input 145 is in the first state, then the first signal output 142 is in a state that is reversed with respect to that of the first signal input 140 and the second signal output 143 is in the same state as the second signal input 141, when the first instruction input 144 is in the first state and the second instruction input 145 is in the second state, then the second signal output 143 is in the state that is reversed with respect to the second signal input 141 and the first signal output 142 is in the same state as the first input signal 140, when the first instruction input 144 is in the second state, then the first signal output 142 is in the same state as the first signal input 140 and the second signal output 143 is in the same state as the second signal input 141.

The module 139 enables a simple shuffling of information that depends on the read and write signals. To enable the use of a module 139 of this kind on the data path, for example, instead of the modules 102 and 109, those skilled in the art must make the circuit a two-way circuit, for example by using gates having a three-state output. It is not necessary to use a signal representing the reading and writing to carry out a shuffling of the data elements if this module 139 is to be used instead of the module 106.

Furthermore, other shuffles of data are possible by means of the transfer gate or again a barrel register. Many variants are possible and have to be adapted as a function of the different places to be occupied (see positions of the modules 102, 103, 106, 109, 110 or even 111).

With respect to the testing of the circuit, the shuffling produced by the circuits described here above are known to the manufacturers of integrated circuits who may modify their testing procedures as a function of the shuffling operations performed which may be different depending on whether they are instructions, addresses or data. If the memory is not properly locked, a user trying to make it work normally will obtain totally inconsistent operation. It must be noted that the shuffling of instructions must be done in such a way that it is not possible to create a short circuit with the exterior of the memory 1 or 11, which could be destructive for a device external to the memory. The shuffling of instructions should not for example dictate a reading operation while the data bus may be at the disposal of the device external to the memory 1 or 11.

Should there be a memory that needs to contain a protected memory zone required to contain highly confidential data elements, it is imperative that there should be a secure scrambling of the data elements. In certain cases, it is even possible to have a test lock that is not irreversible for various reasons of operation (for example through the use of reprogrammable chip cards). The invention proposes a dysfunction circuit that sabotages the data elements present in a memory when the lock is open and when a read and/or write operation has to be performed. The memory must have a mode of testing an instruction designed to initialize all the memory cells, where the resetting has to be done just before the locking.

The principle of the dysfunction circuit is based on a pseudo-random type generator 150, an example of which is shown in FIG. 7. This generator 150 has an instruction input 151, a first and second output 152 and 164. The instruction input 151 receives a binary information element coming from the lock 100 or 107, indicating the state of said lock 100 or 107. The first and second outputs 152 and 164 give information elements that can take a first state or a second state in a pseudo-random manner. In the example, the first output 152 has 16 out of 255 chances of being in the first state and the second output 164 has 128 out of 255 chances of being in the first state. The chances are in fact established cyclically on 255 cycles. Furthermore, it is not possible to have the first state on the first output 152 twice in succession.

The generator 152 furthermore has eight D type flip-flop circuits 153 to 160. Each flip-flop circuit 153 to 160 has one input and one output. The control signals are not indicated for each flip-flop circuit, but they carry out a transfer of the state of the bit present at its input to the interior of the flip-flop circuit whenever a reading is done in the memory. Furthermore, each flip-flop circuit 153 to 160 gives, at its output, the state of the bit that is inside said flip-flop circuit 153 to 160. The input of the first flip-flop circuit 153 is connected to the output of the eighth flip-flop circuit 160. The input of the second flip-flop circuit 154 is connected to the output of a first XOR type gate 161, the first gate 161 having a first input connected to the output of the first flip-flop circuit 153 and a second input being connected to the output of the eighth flip-flop circuit 160. The input of the third flip-flop circuit 155 is connected to the output of a second XOR type gate 162, the second gate 162 having a first input connected to the output of the second flip-flop circuit 154 and a second input being connected to the output of the eighth flip-flop circuit 160. The inputs of the fourth, fifth, sixth and seventh flip-flops 156 to 159 are respectively connected to the outputs of the third, fourth, fifth and sixth flip-flop circuits 155 to 158. The input of the eighth flip-flop circuit 160 is connected to the output of a third XOR type gate 165, the third gate 165 having a first input connected to the output of the seventh flip-flop circuit 159 and a second input being connected to the output of the eighth flip-flop circuit 160. An AND gate 163 having five inputs and one output and its inputs respectively connected to the instruction input 151 and to the outputs of the first, second, fourth and sixth flip-flop circuits 153, 154, 156 and 158. The output of the AND gate 163 is connected to the first output 152. The output of the eighth flip-flop circuit 160 is connected to the second output 164.

Those skilled in the art could ascertain that a circuit of this kind works well provided that all the flip-flop circuits 153 to 160 are not initialized at "0". Furthermore, it is possible to make random generators that use a very large number of cycles making it possible to consider the pseudo-random to be random.

To achieve the function desired, the generator 150 is used together with the module 139. Those skilled in the art will have taken care to modify the module 139 so that it can be used on all the data bits and/or address bits (instead of one or more of the modules 102, 103, 109, 110). The first instruction input 144 of the module 139 has to be connected to the first output 152 of the generator 150 and the second instruction input 145 of the module 139 must be connected to the second output of the generator 164. Furthermore, the first output 152 of the generator 150 must activate a write operation in the control circuit 7 or 22.

Thus, when the test mode is activated, the generator 150 is also activated and is incremented at each read operation performed in the memory and from time to time it will activate a write operation instead of a read operation. Depending on the embodiment actually made by those skilled in the art, the data element written is random or is dependent only on the previously-read or written data element (in any case the data element is erroneous), the writing address corresponding either to a random address or to the address where it is sought to perform the reading operation that activates the writing. If, during the testing of the circuit, a reading operation prompts a writing operation, then it is enough to recommence the reading operation possibly preceded by a writing operation to ascertain that the circuit is working properly, for it is not possible to have two successive cases of dysfunction.

The use of the dysfunction circuit makes it necessary to modify the manufacturer's tests. Indeed, once the conventional manufacturing tests have been performed, the lock must be placed in a locked position and then a test of efficient operation must be performed in order to ascertain that the circuit is working properly, or in other words, in order to ascertain that the lock is properly activated.

Many variants are possible on the basis of the different embodiments proposed. These variants can be obtained by combining the different embodiments in different ways or by modifying them to meet requirements or specific compromises with respect to the product to be obtained. Similarly, all the digital data may be changed without departing from the framework of the invention. Those skilled in the art will have also understood that the first state corresponds in the description to a logic level "1" and the second state to a logic level "0". The different logic gates represented in the diagrams may be easily substituted if it is decided arbitrarily to locally change the first states into the level "0" and the second states into the level "1".

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit comprising:
    a memory zone having a test mode;
    at least one binary type of lock, said lock to permit the operation of the integrated circuit in the test mode when the lock is in a first state, and to prohibit the operation of the integrated circuit in the test mode when the lock is in a second state; and
    a dysfunction circuit coupled to the memory zone to prevent the memory zone from working normally in a non-test mode while permitting the memory zone to be tested when the lock is in the first state.

2. A circuit according to claim 1, wherein the dysfunction circuit delays signals in order to increase the cycle time of the memory.

3. A circuit according to claim 1, wherein the dysfunction circuit comprises a register for delaying data elements by at least one clock cycle after a certain number of clock cycles.

4. A circuit according to claim 1, wherein the dysfunction circuit comprises an address-shuffling circuit for shuffling addresses of the memory.

5. A circuit according to claim 4, wherein the address-shuffling circuit receives a read/write signal and wherein the shuffling of the addresses differs according to whether the operation is a read operation or a write operation.

6. A circuit according to claim 1, further comprising an instruction decoding circuit, wherein the dysfunction circuit acts on the instruction decoding circuit in order to scramble instructions given to the memory.

7. A circuit according to claim 1, wherein the dysfunction circuit comprises a read mode substitution circuit that randomly replaces the read data by erroneous data.

8. A circuit according to claim 1, wherein the dysfunction circuit comprises a write mode substitution circuit that randomly replaces the data to be written by erroneous data.

9. A circuit according to claim 1, wherein the dysfunction circuit comprises a random writing circuit that writes a random data element at a random address whenever a random number of write and/or read cycles has been carried out.

10. A circuit according to claim 1, wherein said lock is in a first state during the manufacture of the circuit and wherein it can be activated only once irreversibly in the second state.

11. A circuit according to claim 2, wherein the dysfunction circuit comprises a register for delaying data elements by at least one clock cycle after a certain number of clock cycles.

12. A circuit according to claim 11, wherein the dysfunction circuit comprises an address-shuffling circuit for shuffling addresses of the memory.

13. A circuit according to claim 12, further comprising an instruction decoding circuit, wherein the dysfunction circuit acts on the instruction decoding circuit in order to scramble instructions given to the memory.

14. A circuit according to claim 13, wherein the dysfunction circuit comprises a read mode substitution circuit that randomly replaces the read data by erroneous data.

15. A circuit according to claim 14, wherein the dysfunction circuit comprises a write mode substitution circuit that randomly replaces the data to be written by erroneous data.

16. A circuit according to claim 15, wherein the dysfunction circuit comprises a random writing circuit that writes a random data element at a random address whenever a random number of write and/or read cycles has been carried out.

17. A circuit according to claim 2, wherein the dysfunction circuit includes an RC circuit that is coupled to an input signal when the lock is in the first state.

18. A circuit according to claim 2, wherein the dysfunction circuit includes a frequency divider that is coupled to an input signal when the lock is in the first state.

19. A circuit according to claim 3, wherein the register is coupled to an input signal when the lock is in the first state.

20. A circuit according to claim 2, wherein the dysfunction circuit acts as a direct connection when the lock is in the second state.

21. A circuit according to claim 3, wherein the dysfunction circuit acts as a direct connection when the lock is in the second state.

22. A memory comprising:

an array of storage cells;

a test lock circuit for enabling a test mode for the array of storage cells in a first state and disabling a test mode for the array of storage cells in a second state;

a dysfunction circuit coupled to the array of storage cells for preventing the storage cells from functioning normally in a non-test mode while permitting the array of storage cells to be tested when the test lock circuit is in the first state, including a first input, a first output, and a first instruction input coupled to the test lock circuit.

23. A memory according to claim 22, wherein the dysfunction circuit includes an RC circuit coupled between the first input and the first output of the dysfunction circuit when the test lock circuit is in the first state.

24. A memory according to claim 23, wherein the first input of the dysfunction circuit is coupled directly to the first output of the dysfunction circuit when the test lock circuit is in the second state.

25. A memory according to claim 22, wherein the dysfunction circuit includes a frequency divider coupled between the first input and the first output of the dysfunction circuit when the test lock circuit is in the first state.

26. A memory according to claim 25, wherein the first input of the dysfunction circuit is coupled directly to the first output of the dysfunction circuit when the test lock circuit is in the second state.

27. A memory according to claim 22, wherein the dysfunction circuit includes a shift register coupled between the first input and the first output of the dysfunction circuit when the test lock circuit is in the first state.

28. A memory according to claim 27, wherein the first input of the dysfunction circuit is coupled directly to the first output of the dysfunction circuit when the test lock circuit is in the second state.

29. A memory according to claim 22, wherein the dysfunction circuit includes a logic circuit, a second input and a second output, wherein when the test lock is in the first state, at least one of the first and second inputs is not in the same respective state as the first and second outputs of the dysfunction circuit.

30. A memory according to claim 29, wherein when the test lock is in the second state, the first and second inputs are in the same respective state as the first and second outputs.

31. A memory according to claim 30, wherein the dysfunction circuit further includes a second instruction input.

32. A memory according to claim 31, wherein the second instruction input is for receiving a read/write input.

33. A memory according to claim 32, wherein when the test lock circuit is in the first state and the second instruction input is in a first state, the first input and the first output are in opposite states, and the second input is in the same state as the second output.

34. A memory according to claim 33, wherein when the test lock circuit is in the first state, and the second instruction input is in a second state, the first input is in the same state as the first output, and the second input and the second output are in opposite states.

35. A memory comprising:

an array of storage cells;

a test lock circuit for enabling a test mode for the array of storage cells in a first state and disabling a test mode for the array of storage cells in a second state;

means coupled to the array of storage cells for preventing the storage cells from functioning normally in a non-test mode while permitting the array of storage cells to be tested when the test lock circuit is in the first state, including an input, an output, and an instruction input coupled to the test lock circuit.

36. The integrated circuit of claim 1, wherein the dysfunction circuit prevents the memory zone from working normally in a non-test mode by generating incorrect data during one of a reading, a writing and an erasing operation of the memory cell.

37. The memory of claim 22, wherein the dysfunction circuit prevents the storage cells from functioning normally in a non-test mode by generating incorrect data during one of a reading, a writing and an erasing operation of the memory cell.

38. The memory of claim 35, wherein the dysfunction circuit prevents the storage cells from functioning normally in a non-test mode by generating incorrect data during one of a reading, a writing and an erasing operation of the memory cell.

* * * * *